US010254312B2

(12) United States Patent
Scranton et al.

(10) Patent No.: US 10,254,312 B2
(45) Date of Patent: Apr. 9, 2019

(54) TRANSMISSION LINE COUPLER FOR TESTING OF INTEGRATED CIRCUITS

(71) Applicant: Avago Technologies International Sales Pte. Limited, Singapore (SG)

(72) Inventors: Timothy Scranton, Irvine, CA (US); Michael Boers, Turramurra (AU); Seunghwan Yoon, Irvine, CA (US); Jesus Castaneda, Long Beach, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 276 days.

(21) Appl. No.: 15/051,134

(22) Filed: Feb. 23, 2016

(65) Prior Publication Data
US 2017/0199226 A1    Jul. 13, 2017

Related U.S. Application Data

(60) Provisional application No. 62/278,250, filed on Jan. 13, 2016.

(51) Int. Cl.
*G01R 31/26* (2014.01)
*G01R 1/073* (2006.01)
*H01P 5/12* (2006.01)
*G01R 1/04* (2006.01)
*H01P 5/02* (2006.01)
*G01R 31/28* (2006.01)

(52) U.S. Cl.
CPC ......... *G01R 1/0735* (2013.01); *G01R 1/0416* (2013.01); *H01P 5/028* (2013.01); *H01P 5/12* (2013.01); *G01R 31/2831* (2013.01)

(58) Field of Classification Search
CPC .................................................... G01R 1/0735
See application file for complete search history.

(56) References Cited

U.S. PATENT DOCUMENTS 3,849,728 A * 11/1974 Evans ................ G01R 1/07314
324/72.5
7,245,139 B2 * 7/2007 Miller ................ G01R 1/07378
324/756.03
2008/0116920 A1 * 5/2008 Kimoto ............. G01R 1/07378
324/754.07

(Continued)

FOREIGN PATENT DOCUMENTS

EP          0484141 A2 *  5/1992  ........... G01R 1/0735

*Primary Examiner* — Minh Q Phan
(74) *Attorney, Agent, or Firm* — Sterne, Kessler, Goldstein & Fox P.L.L.C.

(57) ABSTRACT

The present disclosure describes a semiconductor wafer testing environment for routing signals used for testing integrated circuits formed onto a semiconductor wafer. The semiconductor wafer testing environment includes a semiconductor wafer tester to control overall operation and/or configuration of the semiconductor wafer testing environment and a semiconductor wafer prober to test the integrated circuits formed onto the semiconductor wafer. The semiconductor wafer prober includes a probe card having a transmission line coupler formed onto a flexible substrate. The transmission line coupler includes multiple transmission line coupling blocks that extend radially from a central point of the flexible substrate in a circular manner.

19 Claims, 6 Drawing Sheets

(56) References Cited

U.S. PATENT DOCUMENTS

Figure 1:
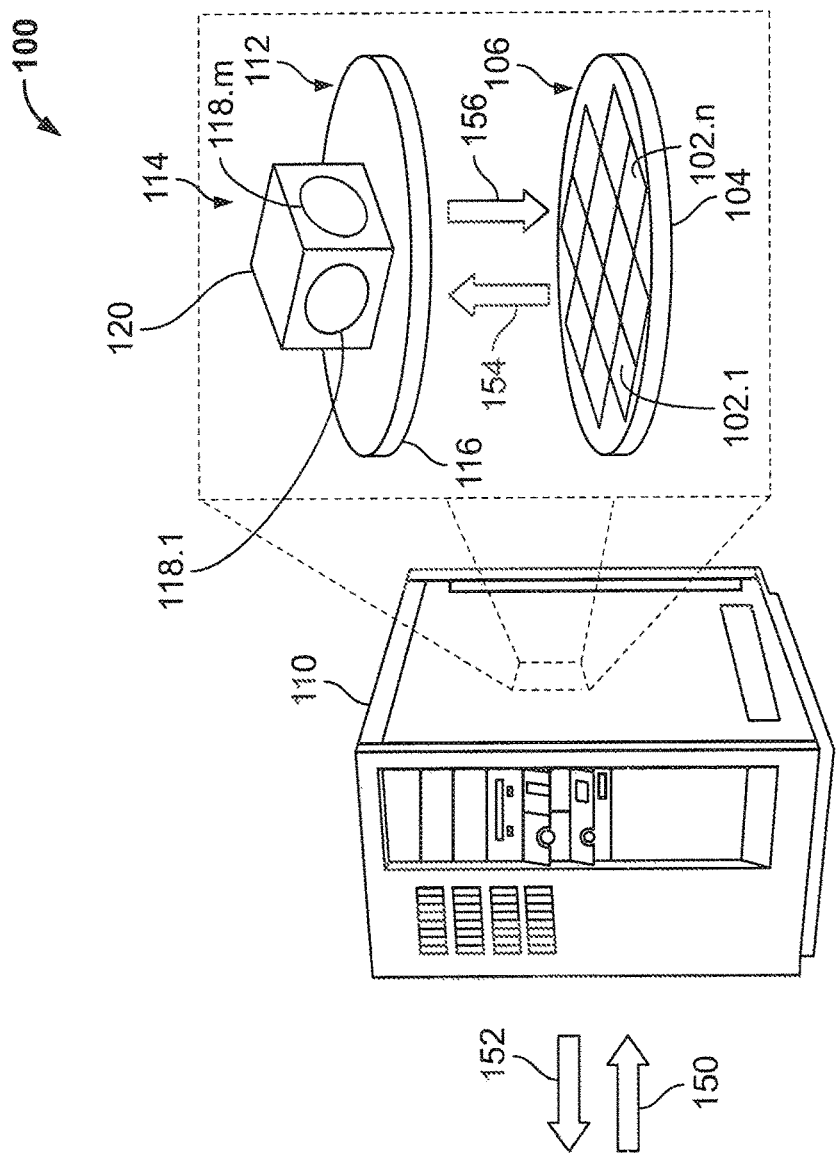

2012/0169367 A1* 7/2012 Kuo ................... G01R 1/06772
                                                        324/756.03
2013/0176048 A1* 7/2013 Furukubo ............. C04B 35/185
                                                        324/756.03

* cited by examiner

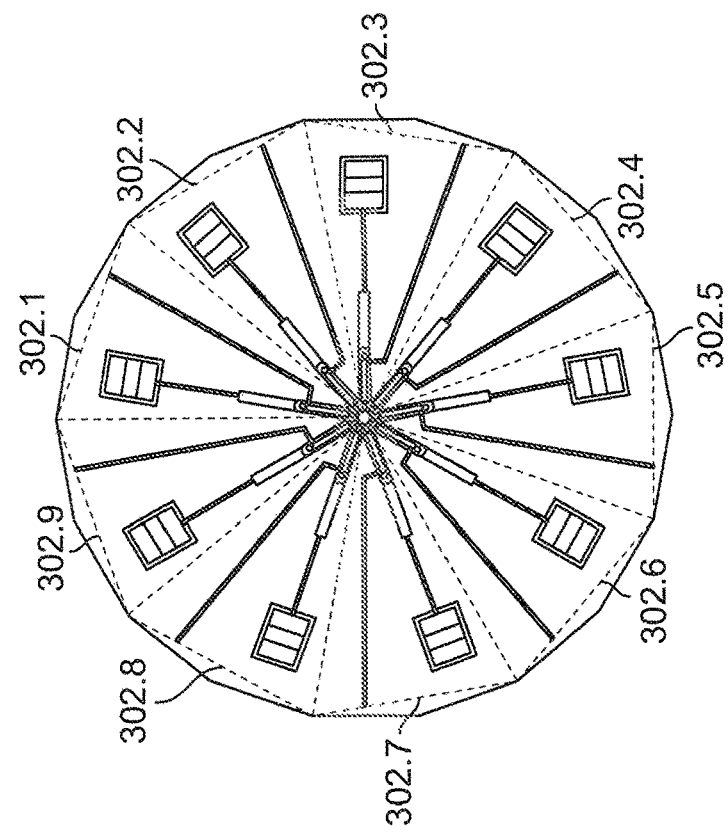
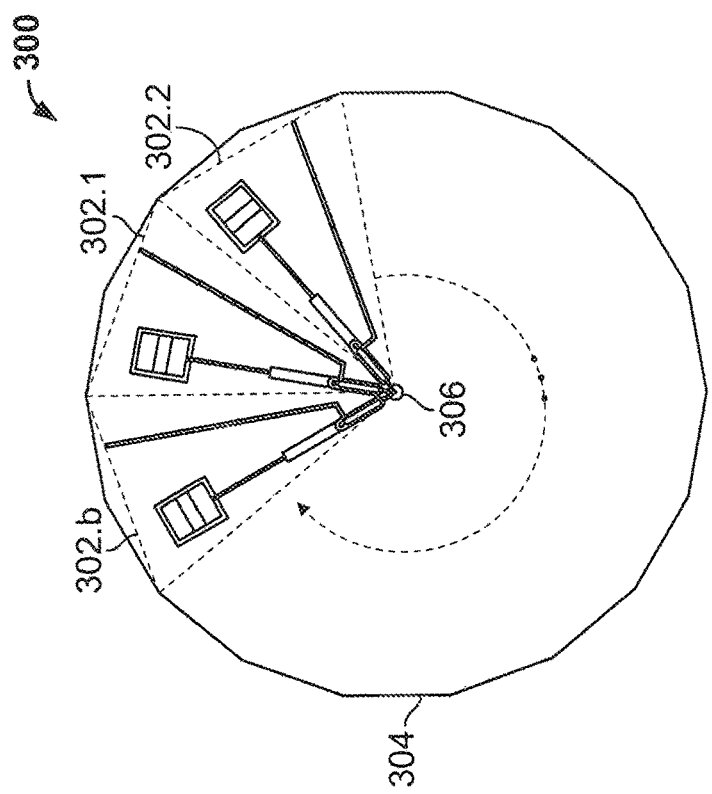
FIG. 3B
FIG. 3A

TRANSMISSION LINE COUPLER FOR TESTING OF INTEGRATED CIRCUITS

CROSS-REFERENCE TO RELATED APPLICATIONS

The present application claims the benefit of U.S. Provisional Patent Appl. No. 62/278,250, filed Jan. 13, 2016, which is incorporated herein by reference in its entirety.

BACKGROUND

Field of Disclosure

The present disclosure relates generally to semiconductor wafer testing, and including a transmission line coupler for routing of signals during the semiconductor wafer testing.

Related Art

A semiconductor device fabrication operation is commonly used to manufacture components onto a semiconductor substrate to form a semiconductor wafer. The semiconductor device fabrication operation uses a predetermined sequence of photographic and/or chemical processing steps to form components onto the semiconductor substrate. However, imperfections within the semiconductor wafer, such as imperfections of the semiconductor substrate, imperfections of the semiconductor device fabrication operation, or imperfections in design of the components themselves, may cause one or more of the semiconductor components to operate differently than expected.

BRIEF DESCRIPTION OF THE DRAWINGS/FIGURES

Figure 2:
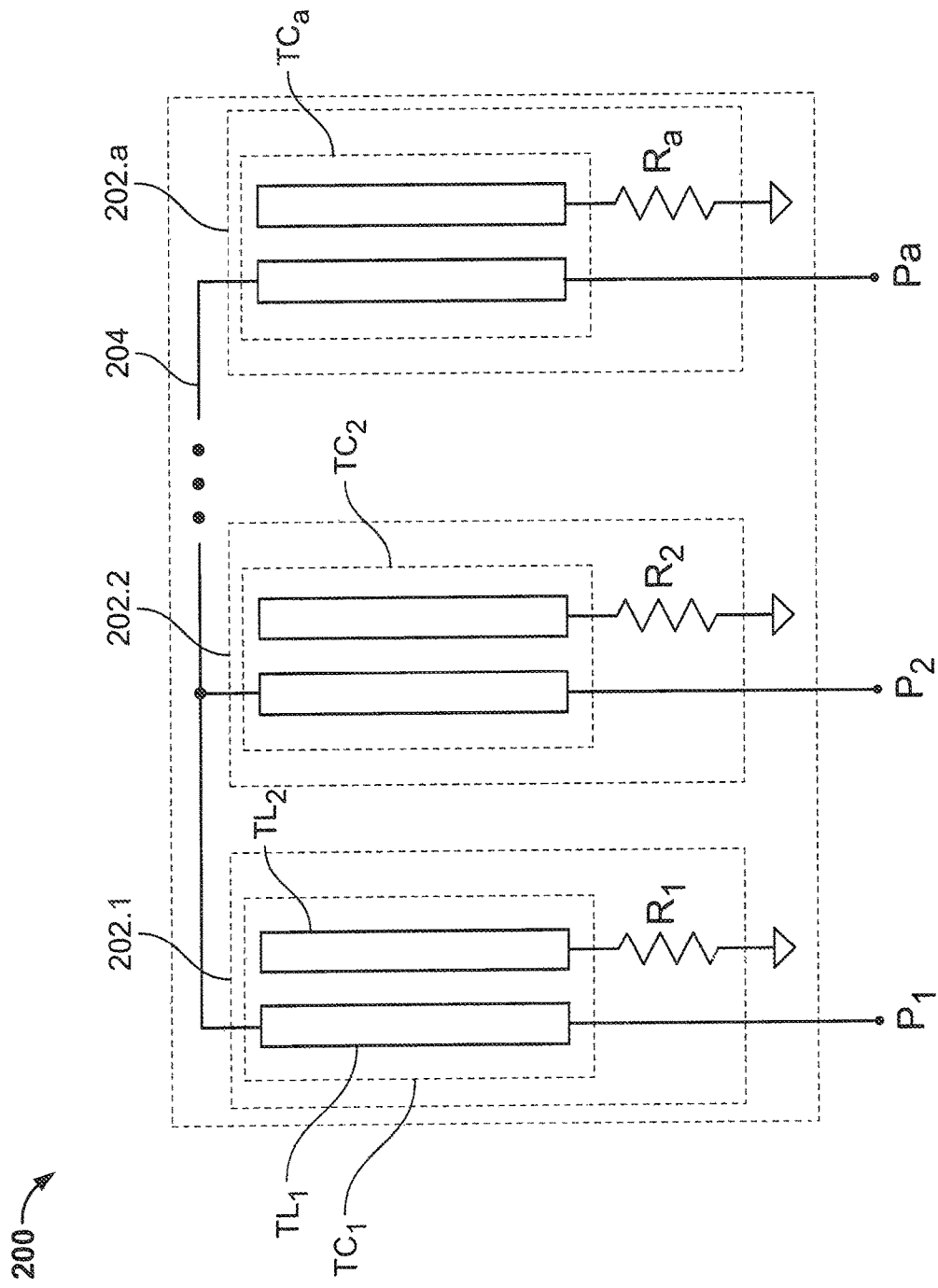
Figure 4:
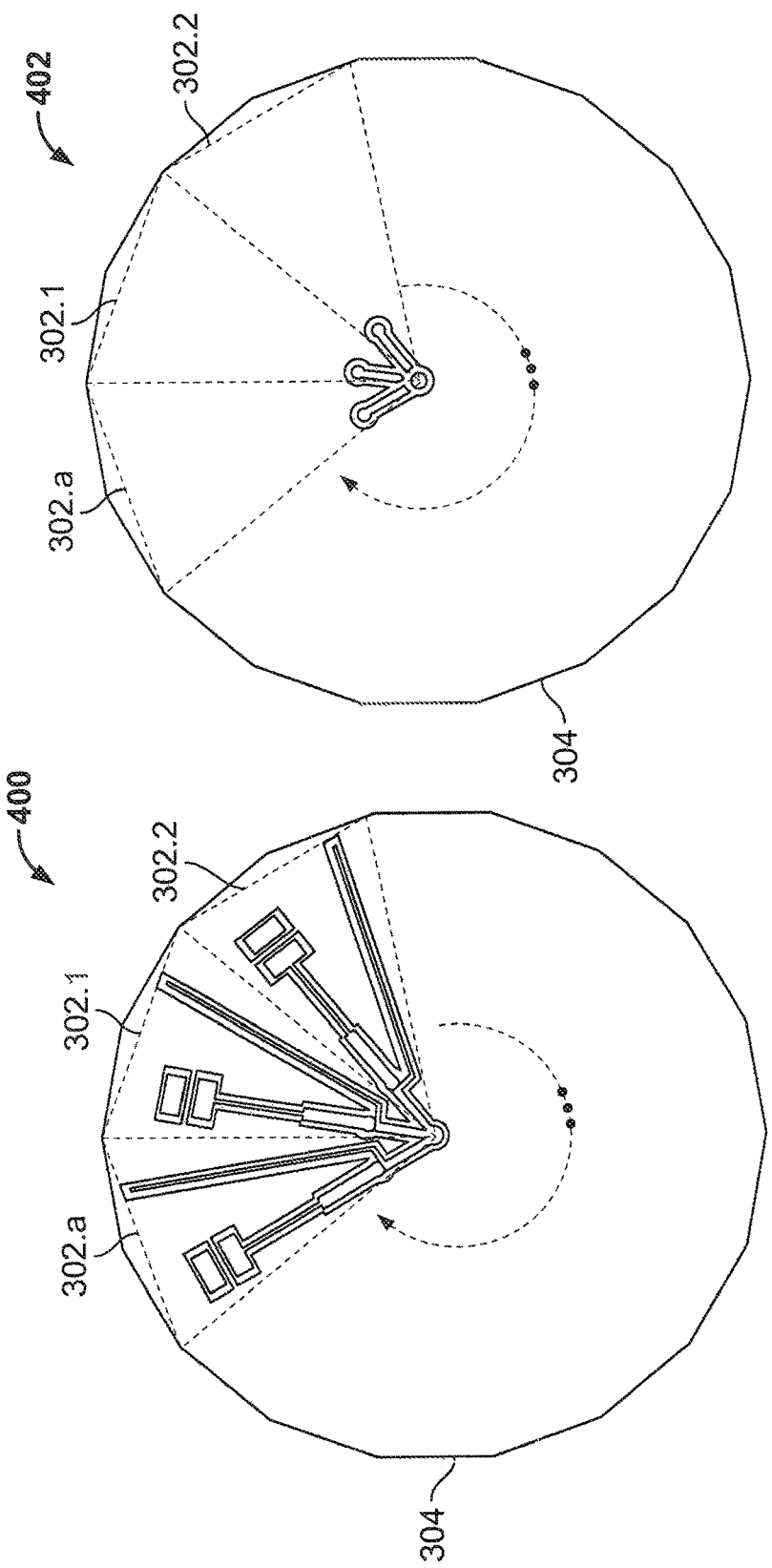
Figure 5:
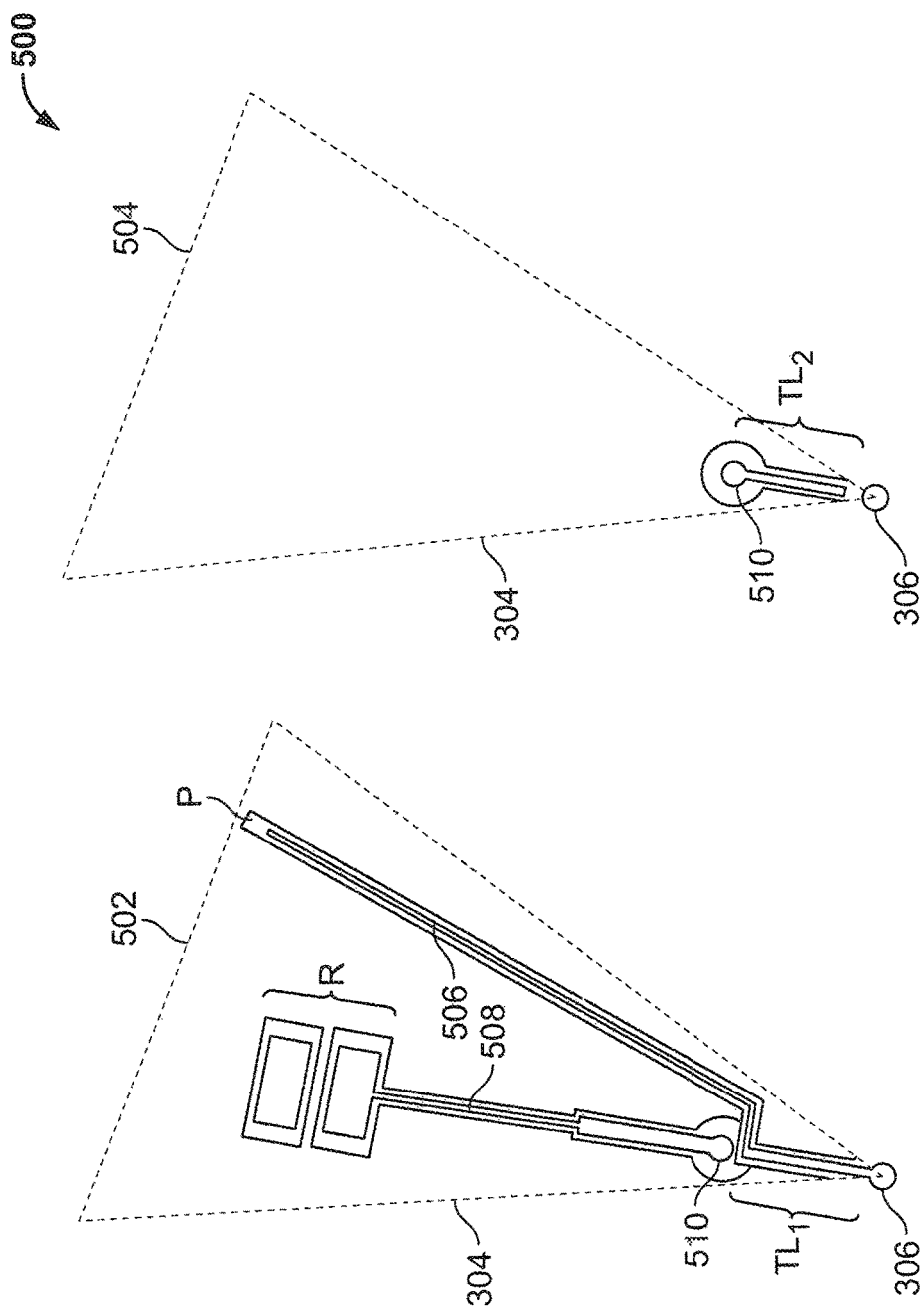
Figure 6:
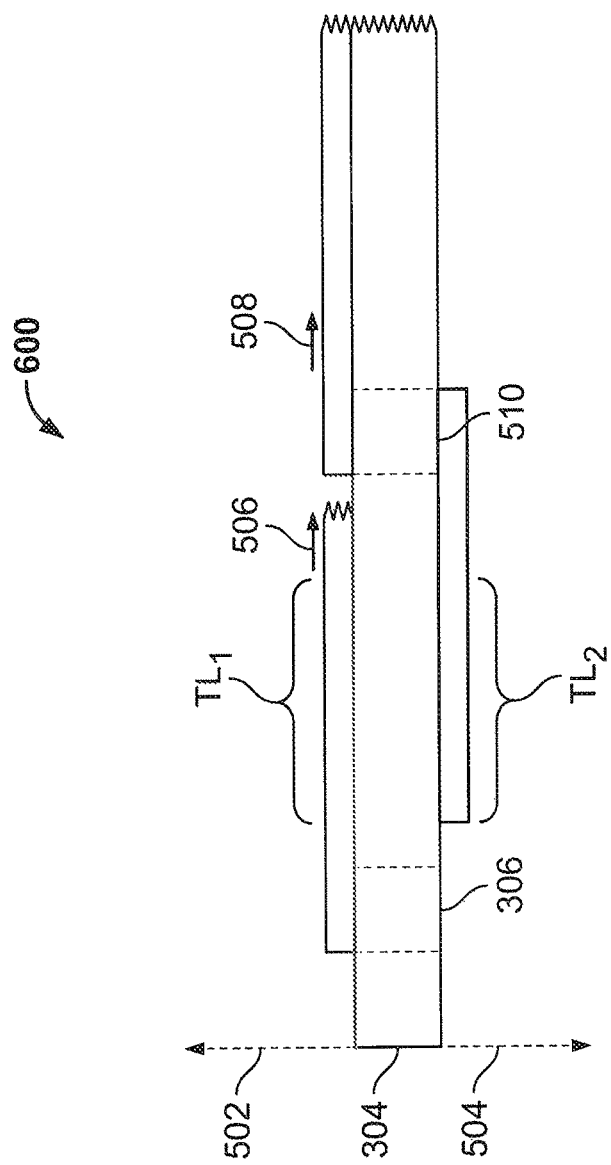

Embodiments of the disclosure are described with reference to the accompanying drawings. In the drawings, like reference numbers indicate identical or functionally similar elements. Additionally, the left most digit(s) of a reference number identifies the drawing in which the reference number first appears. In the accompanying drawings:

FIG. 1 illustrates a semiconductor wafer testing environment according to an exemplary embodiment of the present disclosure;

FIG. 2 schematically illustrates a transmission line coupler that can be implemented within a probe card of the semiconductor wafer testing environment according to an exemplary embodiment of the present disclosure;

FIGS. 3A and 3B illustrate mechanical layouts of the transmission line coupler according to exemplary embodiments of the present disclosure;

FIG. 4 further illustrates the mechanical layout of the transmission line coupler according to an exemplary embodiment of the present disclosure;

FIG. 5 illustrates a mechanical layout of a transmission line coupling block of the transmission line coupler according to an exemplary embodiment of the present disclosure; and FIG. 6 illustrates a mechanical layout of a transmission line coupler of the transmission line coupling block according to an exemplary embodiment of the present disclosure.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

Overview

The present disclosure describes a semiconductor wafer testing environment for routing signals used for testing integrated circuits formed onto a semiconductor wafer. The semiconductor wafer testing environment includes a semiconductor wafer tester to control overall operation and/or configuration of the semiconductor wafer testing environment and a semiconductor wafer prober to test the integrated circuits formed onto the semiconductor wafer. The semiconductor wafer prober includes a probe card having a transmission line coupler formed onto a flexible substrate. The transmission line coupler includes multiple transmission line coupling blocks that extend radially from a central point of the flexible substrate in a circular manner.

Exemplary Semiconductor Wafer Testing Environment

FIG. 1 illustrates a semiconductor wafer testing environment according to an exemplary embodiment of the present disclosure. A semiconductor device fabrication operation is commonly used to manufacture integrated circuits 102.1 through 102.n onto a semiconductor substrate 104 to form a semiconductor wafer 106. The semiconductor device fabrication operation uses a predetermined sequence of photographic and/or chemical processing steps to form the integrated circuits 102.1 through 102.n onto the semiconductor substrate 104. In some situations, imperfections within the semiconductor wafer 106, such as imperfections of the semiconductor substrate 104, imperfections of the semiconductor device fabrication operation, or imperfections in design of the integrated circuits 102.1 through 102.n themselves to provide some examples, may cause one or more of the integrated circuits 102.1 through 102.n to operate differently than expected. A semiconductor wafer testing environment 100 allows for testing of the semiconductor wafer 106 to verify that the integrated circuits 102.1 through 102.n operate as expected. The semiconductor wafer testing environment 100 includes a semiconductor wafer tester 108 and a semiconductor wafer prober 110.

The semiconductor wafer tester 108 controls overall operation and/or configuration of the semiconductor wafer testing environment 100. The semiconductor wafer tester 108 includes one or more source instruments to provide one or more testing signals 150 to the semiconductor wafer prober 110 and/or one or more capture instruments to analyze one or more testing signals 152 received from the semiconductor wafer prober 110. During operation, the semiconductor wafer tester 108 executes one or more testing routines to verify operation of the integrated circuits 102.1 through 102.n. The one or more testing routines include one or more instructions that are executable by the semiconductor wafer tester 108 to verify that the integrated circuits 102.1 through 102.n operate as expected. A first instruction from among the one or more instructions, when executed by the semiconductor wafer tester 108, causes the one or more source instruments to provide the one or more testing signals 150. A second instruction from among the one or more instructions, when executed by the semiconductor wafer tester 108, causes the one or more capture instruments to analyze the one or more testing signals 152 received from the semiconductor wafer prober 110. The testing signals 150 and/or the testing signals 152 can include various optical signals, various electrical signals, such as one or more analog signals and/or one or more digital signals to provide some examples, and/or various other signals that will be readily apparent to those skilled in the relevant art(s) without departing from the spirit and scope of the present disclosure.

In an exemplary embodiment, the one or more analog signals can include radio frequency (RF) signals that are characterized as having a frequency of approximately 60 Gigahertz (GHz).

The semiconductor wafer prober 110 tests the integrated circuits 102.1 through 102.n. During operation, the semiconductor wafer prober 110 loads and unloads the semiconductor wafer 106 for testing. Once the semiconductor wafer 106 has been loaded within the semiconductor wafer prober 110, the semiconductor wafer prober 110 aligns one or more mechanical probes of a probe card 112 with one or more contact pads on the semiconductor wafer 106. In an exemplary embodiment, the semiconductor wafer prober 110 can include automatic pattern recognition optics to align the semiconductor wafer 106 with sufficient accuracy to ensure accurate registration between the one or more contact pads on the semiconductor wafer 106 and the one or more mechanical probes of the probe card 112. After the one or more mechanical probes have been aligned with the one or more contact pads on the semiconductor wafer 106, the semiconductor wafer prober 110 provides the testing signals 150 from the semiconductor wafer tester 108 to the probe card 112 and/or receives the testing signals 152 from the probe card 112.

As illustrated in FIG. 1, the probe card 112 includes a flexible transmission line coupler 114 mechanically mounted and electrically connected to a printed circuit board (PCB) 116. The PCB 116 routes various signals between the semiconductor wafer 106 and semiconductor wafer prober 110, such as testing signals 150, testing signals 152, testing signals 154, and/or testing signals 156 to provide some examples. In an exemplary embodiment, the PCB 116 can include one or more surface mount connectors to electrically connect to various communication cables that are used for routing the testing signals 152 and/or testing signals 150. Although not illustrated in FIG. 1, the PCB 116 includes a mechanical recess beneath the flexible transmission line coupler 114. The one or more mechanical probes of the probe card 112 are positioned within this mechanical recess. The one or more mechanical probes provide electrical connectivity between the semiconductor wafer 106 and the probe card 112 when sufficiently aligned. The one or more mechanical probes receive testing signals 154 from the semiconductor wafer 106 and/or provide the testing signals 156 to the semiconductor wafer 106. In an exemplary embodiment, the one or more mechanical probes attach directly to the flexible transmission line coupler 114, which in turn connects electrically and mechanically to the PCB 116. However, in another exemplary embodiment, the mechanical probes may connect directly to the PCB 116, and the transmission line coupler 114 may connect to the PCB 116 separately.

The flexible transmission line coupler 114 includes transmission line couplers 118.1 through 118.m. formed onto a flexible substrate 120, to route the testing signals 150 to the semiconductor wafer 106 as the testing signals 156 and/or to route the testing signals 154 from the semiconductor wafer 106 as the testing signals 152.

Exemplary Electrical Schematic of a Transmission Line Coupler that can be Implemented with a Probe Card of the Semiconductor Wafer Testing Environment FIG. 2 schematically illustrates a transmission line coupler that can be implemented within a probe card of the semiconductor wafer testing environment according to an exemplary embodiment of the present disclosure. Although the discussion of the transmission line coupler to follow is described in terms of the semiconductor wafer testing environment, this is for illustrative purposes only. Those skilled in the relevant art(s) will recognize that the transmission line coupler can be used in other environments without departing from the spirit and scope of the present disclosure. For example, the transmission line coupler can be implemented on a generic PCB as part of a transmitter, receiver, or transceiver within a communications environment.

As discussed above, the transmission line couplers 118.1 through 118.m route the testing signals 150, the testing signals 152, the testing signals 154, and/or the testing signals 156 between the semiconductor wafer tester 108 and the integrated circuits 102.1 through 102.n by way of the one or more mechanical probes. A transmission line coupling circuit 200 represents an exemplary embodiment of one or more of the transmission line couplers 118.1 through 118.m. The transmission line coupling circuit 200 includes transmission line coupling blocks 202.1 through 202.a. In an exemplary embodiment, the transmission line coupling blocks 202.1 through 202.a include transmission line coupling blocks 202.1 through 202.9 that are configured to route various signals at frequencies in the GHz range, such as approximately 60 GHz to provide an example. The transmission line coupling blocks 202.1 through 202.a include transmission line couplers $TC_1$ through $TC_a$ which are coupled to ports $P_1$ through $P_a$ and load resistors $R_1$ through $R_a$. In an exemplary embodiment, the load resistors $R_1$ through $R_a$ represent surface mount resistors. The transmission line coupling blocks 202.1 through 202.a operate in a substantially similar manner; therefore, only the transmission line coupling block 202.1 is to be discussed in further detail below.

The transmission line coupler $TC_1$ represents a pair of coupled transmission lines. The pair of coupled transmission lines represent bidirectional transmission lines to route various signals between the port $P_1$ and one or more of the transmission line coupling blocks 202.1 through 202.9. The pair of coupled transmission lines can be implemented using planar waveguides, such as stripline or microstrip to provide some examples. In an exemplary embodiment, the dimensions for the pair of coupled transmission lines are fractionally related to a wavelength (λ), such as $$\frac{\lambda}{4}$$

to provide an example, of signals routed by the transmission line coupling block 202.1. In some situations, the pair of coupled transmission lines of each of the transmission line couplers $TC_1$ through $TC_a$ can have different dimensions. However, it is preferred that the pair of coupled transmission lines of each of the transmission line couplers $TC_1$ through $TC_a$ have substantially similar dimensions such that network parameters, such as admittance parameters (y-parameters), scattering parameters (S-parameters), and/or scattering transfer parameters (T-parameters) to provide some examples, for each of the transmission line coupling blocks 202.1 through 202.a are substantially similar to each other.

As illustrated in FIG. 2, a first coupled transmission line $TL_1$ from among the coupled transmission lines connects the port $P_1$ and the transmission line coupling blocks 202.2 through 202.a. The port $P_1$ can be connected to a mechanical probe, such as the one or more mechanical probes mentioned above, to route signals to and/or from a semiconductor wafer, such as the semiconductor wafer 106 to provide an example, or communicatively connected to a source instrument, such as the one or more source instruments of the semiconductor wafer tester 108 to provide an example.

A first terminal of a second coupled transmission line $TL_2$ from among the coupled transmission lines is connected to the load resistor $R_1$ and a second terminal of the second coupled transmission line $TL_2$ is not terminated. In an exemplary embodiment, the load resistor $R_1$ is selectively chosen, approximately 25Ω to provide an example, to match an impedance present on the port $P_1$ to an internal impedance of the transmission line coupling circuit 200 at node 204. For example, the load resistor $R_1$ can assume a value of approximately 25Ω to match the internal impedance of the transmission line coupling circuit 200 between approximately 5Ω and approximately 6Ω when nine transmission line coupling blocks 202.1 through 202.9 are present within the transmission line coupling circuit 200 and ports $P_1$ through $P_9$ are terminated with an impedance of approximately 50Ω. In the exemplary embodiment illustrated in FIG. 2, the load resistor $R_1$ is further connected to ground. However, in another exemplary embodiment, the load resistor $R_1$ is not terminated to ground. This other exemplary embodiment can be particular useful when the signals being routed by the transmission line coupler are high enough in frequency that the inductive reactance of the signal path creates a notable impedance relative to load resistor $R_1$. In this other exemplary embodiment, the direct termination of the load resistor $R_1$ to ground can be replaced with a capacitive connection to ground. In a further exemplary embodiment, the load resistor $R_1$ represents a surface mount resistor that is attached, typically by soldering, to one or more surface mounting pads. In this further embodiment, the pad geometries of the one or more surface mounting pads can be adjusted or "tuned" such that their shunt capacitance to ground resonates with the sum of various series inductance values, namely, 1) a signal path to the load resistor $R_1$, 2) a series inductance of the surface mount resistor itself, and 3) a ground return path. In this manner, the inductive parasitics of the signal path are cancelled out and the load resistor R1 electrically behaves as the desired, real resistance value necessary for proper matching.

Exemplary Mechanical Layout of the Transmission Line Coupler

FIG. 3A illustrates a mechanical layout of the transmission line coupler according to an exemplary embodiment of the present disclosure. As illustrated in FIG. 3, a transmission line coupling circuit 300 includes transmission line coupling blocks 302.1 through 302.b formed onto a flexible substrate 304 to form a flexible circuit. In an exemplary embodiment, the transmission line coupling circuit 300 includes transmission line coupling blocks 302.1 through 302.9 as illustrated in FIG. 3B. The transmission line coupling circuit 300 can represent an exemplary embodiment of the transmission line coupling circuit 200. As such, the transmission line coupling blocks 302.1 through 302.b can represent an exemplary embodiment of the transmission line coupling blocks 202.1 through 202.a.

The flexible substrate 304 forms a foundation for the transmission line coupling circuit 300. The flexible substrate 304 can be implemented using polyimide, polyether ether ketone (PEEK) or transparent conductive polyester film. As illustrated in FIG. 3A, the transmission line coupling circuit 300 can be implemented as a double-sided flex circuit having two conductive layers on the flexible substrate 304. However, those skilled in the relevant art(s) will recognize that the transmission line coupling circuit 300 can be implemented as a single-sided flex circuit having a single conductive layer on the flexible substrate 304 to form the transmission line coupling circuit 300 and/or a multilayer flex circuit having three or more conductive layers on and/or within the flexible substrate 304 to form the transmission line coupling circuit 300. The flexible substrate 304 can be implemented in a shape of a regular closed geometric structure, such as a regular polygon as illustrated in FIG. 3A to provide an example, an irregular closed structure, such as an irregular polygon to provide an example, and/or any suitable combination of these closed structures that will be apparent to those skilled in the relevant art(s).

As illustrated in FIG. 3A, the transmission line coupling blocks 302.1 through 302.b are formed onto the flexible substrate 304 in a circular manner around a central point 306 of the flexible substrate 304. For example, the transmission line coupling block 302.1 extends radially from the central point 306 in a first radial direction and the transmission line coupling block 302.2, adjacent to the transmission line coupling block 302.1 in the circular manner, extends radially from the central point 306 in a second radial direction. The transmission line coupling blocks 302.1 through 302.b are formed using one or more conductive materials patterned onto one or more conductive layers of the flexible substrate 304. In an exemplary embodiment, each of the transmission line coupling blocks 302.1 through 302.b are formed in a substantially similar symmetrical manner around the central point 306. The one or more conductive materials can include aluminum (Al), Copper (Cu), Silver (Ag), Gold (Au), Tin (Sn), or Nickel (Ni) to provide some examples, and/or combinations of these materials. In another exemplary embodiment, the transmission line coupling blocks 302.1 through 302.b are formed using thin film deposition of the one or more conductive materials. In another exemplary embodiment, the transmission line coupling blocks 302.1 through 302.b are formed using a conductive foil material of the one or more conductive materials.

FIG. 4 further illustrates the mechanical layout of the transmission line coupler according to an exemplary embodiment of the present disclosure. As discussed above, the transmission line coupling circuit 300 can be implemented as a double-sided flex circuit having two conductive layers on the flexible substrate 304. As illustrated in FIG. 4, the transmission line coupler can be formed on a first conductive layer 400 of the flexible substrate 304, also referred to a top side of the flexible substrate 304, and a second conductive layer of the flexible substrate 304, also referred to a bottom side of the of the flexible substrate 304. It should be noted that the configuration and arrangement of the transmission line coupling blocks 302.1 through 302.b as illustrated in FIG. 4 is for illustrative purposes only. Those skilled in the relevant art(s) will recognize that other configurations and arrangements of the transmission line coupling blocks 302.1 through 302.b are possible without departing from the spirit and scope of the disclosure.

FIG. 5 illustrates a mechanical layout of a transmission line coupling block of the transmission line coupler according to an exemplary embodiment of the present disclosure. A transmission line coupling block 500 is formed onto a first conductive layer 502 of the flexible substrate 304 and a second conductive layer 504 of the flexible substrate 304. The transmission line coupling block 500 can represent an exemplary embodiment of one or more of the transmission line coupling blocks 302.1 through 302.b. As illustrated in FIG. 5, the first conductive layer 502 includes a first conductive trace 506 extending from a port P of the transmission line coupling block 500, such as one or more of ports $P_1$ through $P_a$ in FIG. 2 to provide an example, to a first coupled transmission line $TL_1$ of a transmission line coupler, such as one or more of the transmission line couplers $TC_1$ through $TC_a$ in FIG. 2 to provide an example. As additionally illustrated in FIG. 5, the first conductive layer 502 includes a second conductive trace 508 between a load resistor R, such as one of the load resistors $R_1$ through $R_a$ to provide an example, and a via 510. This via 510 electrically connects the second conductive trace 508 to a second coupled transmission line $TL_2$ of the transmission line coupler on the second conductive layer 504. In some situations, trace widths of the first conductive trace 506 and of the second conductive trace 508 can vary, for example, to achieve a desired characteristic impedance. For example, as illustrated in FIG. 5, a first trace width of a first portion of the second conductive trace 508 is less than a second trace width of a second portion of the second conductive trace 508. Moreover, the trace widths of the first coupled transmission line $TL_1$ and/or the second coupled transmission line $TL_2$ can also be changed to achieve a desired coupling factor and/or impedance match as will be recognized by those skilled in the relevant art(s) without departing from the spirit and scope of the present disclosure.

FIG. 6 illustrates a mechanical layout of a transmission line coupler of the transmission line coupling block according to an exemplary embodiment of the present disclosure. A transmission line coupler 600 is formed onto the first conductive layer 502 of the flexible substrate 304 and the second conductive layer 504 of the flexible substrate 304. The transmission line coupler 600 can represent an exemplary embodiment of one or more of the transmission line couplers $TC_1$ through $TC_a$ in FIG. 2.

As illustrated in FIG. 6, a first end of a first coupled transmission line $TL_1$ of the transmission line coupler 600 is electrically connected to the central point 306 and a second end of the first coupled transmission line $TL_1$ is electrically connected to the first conductive trace 506 on the first conductive layer 502. A portion of the first conductive trace 506 is illustrated in FIG. 6.

A first end of a second coupled transmission line $TL_2$ of the transmission line coupler 600 is unterminated and not electrically connected to the central point 306. A second end of the second coupled transmission line $TL_2$ is connected to the via 510 on the second conductive layer 504. The via 510 is further electrically connected to the second conductive trace 508 on the first conductive layer 502. A portion of the second conductive trace 508 is illustrated in FIG. 6.

As shown in FIG. 6, the first coupled transmission line $TL_1$ and the second coupled transmission line $TL_2$ are disposed on opposing sides of the flexible substrate 304, and at least partially overlay one another to effect spatial coupling of electrical signals between the first coupled transmission line $TL_1$ and the second coupled transmission line $TL_2$.

CONCLUSION

The Detailed Description referred to accompanying figures to illustrate exemplary embodiments consistent with the disclosure. References in the disclosure to "an exemplary embodiment" indicates that the exemplary embodiment described include a particular feature, structure, or characteristic, but every exemplary embodiment can not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The exemplary embodiments described within the disclosure have been provided for illustrative purposes, and are not intend to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based on the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:
1. A transmission line coupling circuit, comprising:
a flexible substrate; and
a plurality of transmission line coupling blocks formed onto the flexible substrate in a circular manner around a central point of the flexible substrate, the plurality of transmission line coupling blocks comprising:
a plurality of first coupled transmission lines implemented on a top side of the flexible substrate and connected to the central point,
a plurality of first conductive traces implemented on the top side of the flexible substrate and connected between the plurality of first coupled transmission lines and a plurality of ports,
a plurality of second coupled transmission lines implemented on a bottom side of the flexible substrate and connected to a plurality of vias, and
a plurality of second conductive traces implemented on the top side of the flexible substrate and connected between the plurality of vias and a plurality of load resistors.
2. The transmission line coupling circuit of claim 1, wherein the plurality of first coupled transmission lines and the plurality of second coupled transmission lines each comprises:
conductive foil material.
3. The transmission line coupling circuit of claim 1, wherein the plurality of load resistors comprises:
a plurality of surface mount resistors.

4. The transmission line coupling circuit of claim 1, wherein the flexible substrate comprises:
polyimide.

5. The transmission line coupling circuit of claim 1, wherein the plurality of load resistors is configured to match impedances present on the plurality of ports to an internal impedance of the transmission line coupling circuit.

6. The transmission line coupling circuit of claim 1, wherein the plurality of second coupled transmission lines is not connected to the central point.

7. The transmission line coupling circuit of claim 1, wherein the plurality of first coupled transmission lines and the plurality of second coupled transmission lines are configured to form a plurality of transmission line couplers.

8. The transmission line coupling circuit of claim 1, wherein dimensions of first coupled transmission lines and the plurality of second coupled transmission lines are fractionally related to a wavelength of signals routed by the transmission line coupling circuit.

9. A probe card for testing a plurality of integrated circuits formed onto a semiconductor substrate forming a semiconductor wafer, the probe card comprising:
a plurality of mechanical probes configured to contact a plurality of contact pads on the semiconductor wafer; and
a plurality of transmission line coupling circuits connected to the plurality of mechanical probes, the plurality of transmission line coupling circuits configured to route a plurality of testing signals between the semiconductor wafer and a semiconductor wafer tester,
wherein a transmission line coupling circuit from among the plurality of transmission line coupling circuits comprises:
a flexible substrate,
a plurality of transmission line coupling blocks formed onto the flexible substrate in a circular manner around a central point of the flexible substrate, the plurality of transmission line coupling blocks comprising:
a plurality of first coupled transmission lines implemented on a top side of the flexible substrate and connected to the central point,
a plurality of first conductive traces implemented on the top side of the flexible substrate and connected between the plurality of first coupled transmission lines and a plurality of ports, one or more of the plurality of ports being configured to route one or more testing signals from among the plurality of testing signals between the semiconductor wafer and the semiconductor wafer tester,
a plurality of second coupled transmission lines implemented on a bottom side of the flexible substrate and connected to a plurality of vias, and
a plurality of second conductive traces implemented on the top side of the flexible substrate and connected between the plurality of vias and a plurality of load resistors.

10. The probe card of claim 9, wherein the plurality of first coupled transmission lines and the plurality of second coupled transmission lines each comprises:
thin film deposition.

11. The probe card of claim 9, wherein the plurality of load resistors comprises:
a plurality of surface mount resistors.

12. The probe card of claim 9, wherein the flexible substrate comprises:
polyimide.

13. The probe card of claim 9, wherein the plurality of load resistors is configured to match impedances present on the plurality of ports to an internal impedance of the transmission line coupling circuit.

14. The probe card of claim 9, wherein the plurality of second coupled transmission lines is not connected to the central point.

15. The probe card of claim 9, wherein the plurality of first coupled transmission lines and the plurality of second coupled transmission lines are configured to form a plurality of transmission line couplers.

16. The probe card of claim 9, wherein dimensions of first coupled transmission lines and the plurality of second coupled transmission lines are fractionally related to a wavelength of the plurality of testing signals.

17. A transmission line coupling block of a transmission line coupling circuit, the transmission line coupling block comprising:
a transmission line coupler having a first coupled transmission line and a second coupled transmission line; and
a flexible substrate having a top side and a bottom side,
wherein the first coupled transmission line is implemented on the top side of the flexible substrate and the second coupled transmission line is implemented on the bottom side of the flexible substrate,
a first conductive trace connected between a port and the first coupled transmission line, and
a second conductive trace connected between a load resistor and a via, the via being connected to the second coupled transmission line,
wherein the transmission line coupling block is from among a plurality of transmission line coupling blocks, the plurality of transmission line coupling blocks formed onto the flexible substrate in a circular manner around a central point of the flexible substrate.

18. The transmission line coupling block of claim 17, wherein the flexible substrate comprises:
polyimide.

19. The transmission line coupling block of claim 17, wherein the first coupled transmission line is connected to the central point, and
wherein the second coupled transmission line is not connected to the central point.

* * * * *